(12) United States Patent
Wille

(10) Patent No.: US 7,683,836 B2
(45) Date of Patent: Mar. 23, 2010

(54) ANTENNA WITH THERMALLY TRANSFERRED ELEMENT

(75) Inventor: Paul F. Wille, Scottsdale, AZ (US)

(73) Assignee: World Properties, Inc., Lincolnwood, IL (US)

( * ) Notice: Subject to any disclaimer, the term of this patent is extended or adjusted under 35 U.S.C. 154(b) by 173 days.

(21) Appl. No.: 11/818,482

(22) Filed: Jun. 13, 2007

(65) Prior Publication Data

US 2008/0309560 A1    Dec. 18, 2008

(51) Int. Cl.
*H01Q 1/38* (2006.01)
*H01Q 1/36* (2006.01)

(52) U.S. Cl. ............................. 343/700 MS; 343/895
(58) Field of Classification Search .......... 343/700 MS, 343/895; 264/272.11, 272.14; 340/572.7, 340/572.8; 428/209, 458, 901
See application file for complete search history.

(56) References Cited

U.S. PATENT DOCUMENTS

| 7,083,739 | B2 * | 8/2006 | Furukawa et al. | 216/33 |
| 7,250,868 | B2 * | 7/2007 | Kurz et al. | 340/572.7 |
| 7,456,748 | B2 * | 11/2008 | Cheng et al. | 340/572.7 |
| 2002/0018880 | A1 * | 2/2002 | Young | 428/209 |
| 2007/0257398 | A1 * | 11/2007 | Moncrieff | 264/272.11 |

* cited by examiner

*Primary Examiner*—Hoang V Nguyen
(74) *Attorney, Agent, or Firm*—Paul F. Wille

(57) ABSTRACT

An antenna includes an element that is made by thermally bonding a patterned conductive layer to a dielectric sheet. The antenna can be redesigned easily for prototype or low volume production yet the invention is suitable for volume production as well. The antenna, or an element thereof, can be made from a xerographic print using toner as an adhesive.

10 Claims, 2 Drawing Sheets

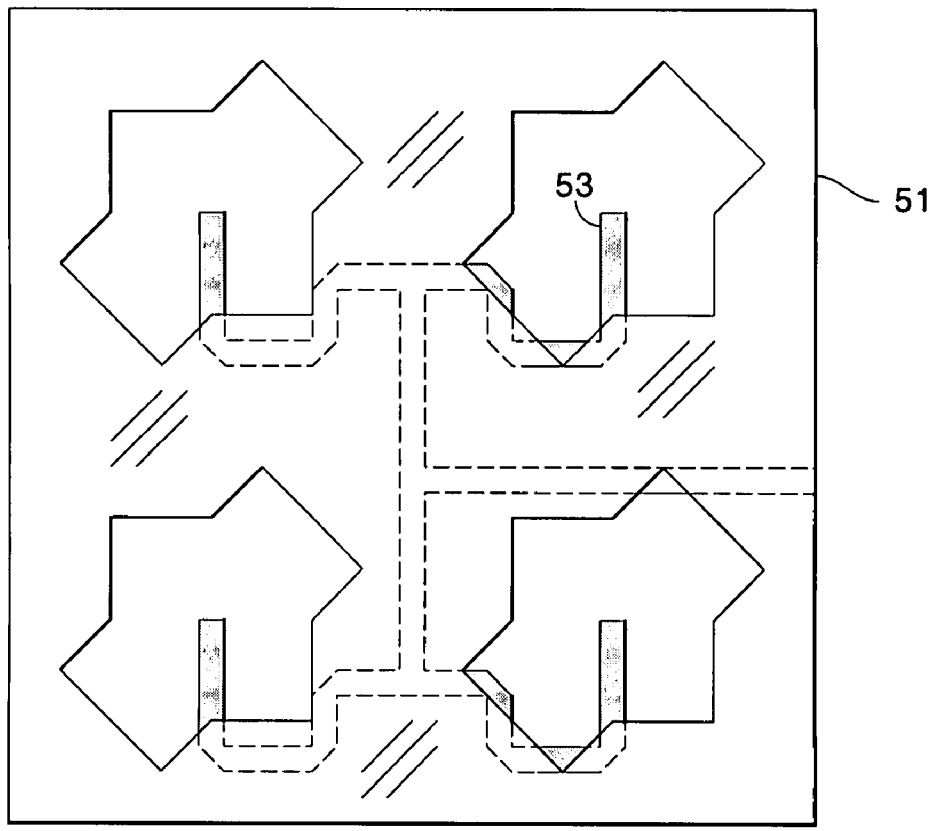
F I G. 5
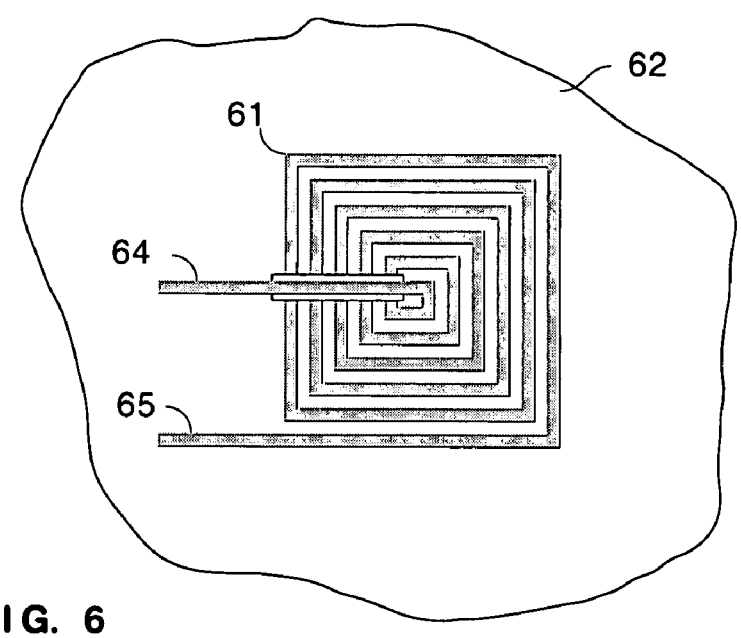
F I G. 6

ANTENNA WITH THERMALLY TRANSFERRED ELEMENT

BACKGROUND TO THE INVENTION

This invention relates to antennas and, in particular, to an antenna having elements thermally transferred to a dielectric sheet.

A variety of antennas are known in the art that use planar conductive elements; e.g. planar, phased array antennas, U.S. Pat. No. 3,587,110 (Woodward); spiral antennas, U.S. Pat. No. 3,509,465 (Andre et al.); a cavity combined with a spiral antenna U.S. Pat. No. 3,441,937 (Clasby et al.), and dipole arrays, U.S. Pat. No. 6,731,248 (Killen et al.). Another pattern of conductive elements is a fractal antenna; e.g. U.S. Pat. No. 6,104,349 (Cohen). Typically, the conductive elements of the antenna are produced by applying a conductive layer to a substrate and then patterning the layer; e.g., U.S. Pat. No. 6,731,248.

At ultra high frequencies, approximately 12 GHz, the wavelength is approximately 2.50 cm, which means that even seemingly small changes in dimension can be substantial fractions of a wavelength. Patterning conductive layers can be controlled to small fractions of a centimeter but the process for forming the conductive layers is expensive, uses solvents or other chemicals that must be disposed of properly, and is ill suited to making small quantities or experimental samples.

It is known in the art to use a plurality of thermal pins in an array for printing; e.g. see U.S. Pat. No. 3,855,448 (Hanagata et al.). It is also known in the art to thermally print electrically conductive carbon black from a ribbon; e.g. see U.S. Pat. No. 4,269,892 (Shattuck et al.).

In view of the foregoing, it is therefore an object of the invention to provide an antenna that is made by thermally bonding elements to a dielectric sheet.

Another object of the invention is to provide an antenna that can be changed easily for prototype or low volume production.

A further object of the invention is to provide an antenna in which an element is thermally bonded to a dielectric sheet by toner powder.

SUMMARY OF THE INVENTION

The foregoing objects are achieved by this invention in which an antenna includes an element that is made by thermally bonding a patterned conductive layer to a dielectric sheet. The antenna can be redesigned easily for prototype or low volume production yet the invention is suitable for volume production as well. The antenna, or an element thereof, can be made from a xerographic print using toner as an adhesive.

BRIEF DESCRIPTION OF THE DRAWINGS

A more complete understanding of the invention can be obtained by considering the following detailed description in conjunction with the accompanying drawings, in which:

FIG. 5 is a plan view of a antenna constructed with thermally adhered elements; and FIG. 6 is a plan view of an inductor or coiled antenna using thermally transferred conductive foil.

DETAILED DESCRIPTION OF THE INVENTION

Figure 1:
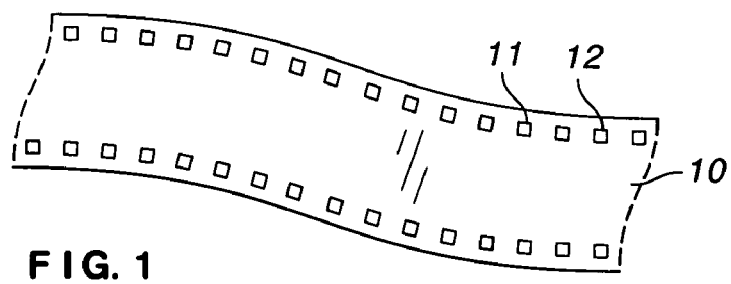
FIG. 1 illustrates a ribbon having a thermally transferable conductive layer.

FIG. 1 illustrates a ribbon having a thermally transferable conductive layer. Ribbon 10 is flexible but dimensionally stable and preferably includes registration guides, illustrated as sprocket holes 11 and 12. The registration guides can be optical rather than mechanical. The dimensions of the ribbon are determined by application. In accordance with one aspect of this invention, wherein toner powder is used as an adhesive, the ribbon can be a standard size sheet of paper to facilitate handling by a xerographic printer. The printer can print fiduciary marks as registration guides at the same time that the element of an antenna is printed.

Figure 2:
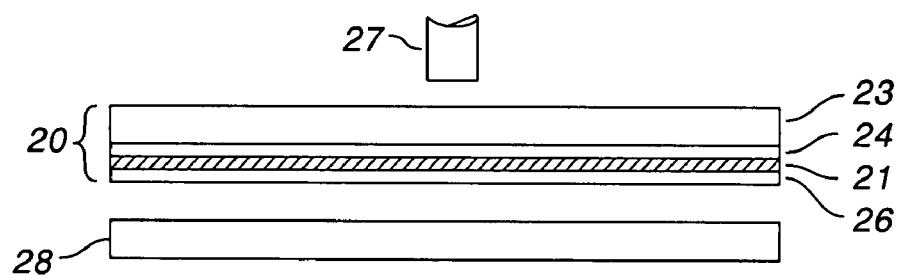
FIG. 2 illustrates, in cross-section, a method for bonding a conductive layer to substrate.

FIG. 2 illustrates a preferred method for bonding a conductive layer to a dielectric sheet. In this embodiment of the invention, ribbon 20 includes conductive layer 21 overlying substrate 23 and adhesive layer 26 overlying the conductive layer. Conductive layer 21 is attached to substrate 23 by release layer 24 that has the characteristic of being less adhesive than adhesive layer 26. Thus, when layer 26 is softened or activated by heat, conductive layer 21 will separate from substrate 23. Conductive layer 21 is a thin (on the order of thousands of angstroms) layer of metal, such as copper or aluminum.

Ribbon 20 and dielectric sheet 28 are illustrated in FIG. 2 as slightly spaced for clarity. For transfer, the two are brought together and heated pin 27 is brought down to transfer a portion of conductive layer 21 to dielectric sheet 28. Pin 27 is one of a plurality of pins, somewhat like in a dot matrix printer. The combination of heat and pressure effect the transfer. The pins can be actuated individually, thereby controlling the resulting pattern in conductive layer 21 when it adheres to dielectric sheet 28. The resolution of the pattern depends upon the diameter of the pins, which can be quite small; e.g. 0.005". The conductive layer is transferred in successive areas across the back of the panel. Because a ribbon is used and the process can be repeated in steps, the size of the ribbon does not affect the size of dielectric sheet 28 and the size of the dielectric sheet does not affect the size of the ribbon.

Figure 3:
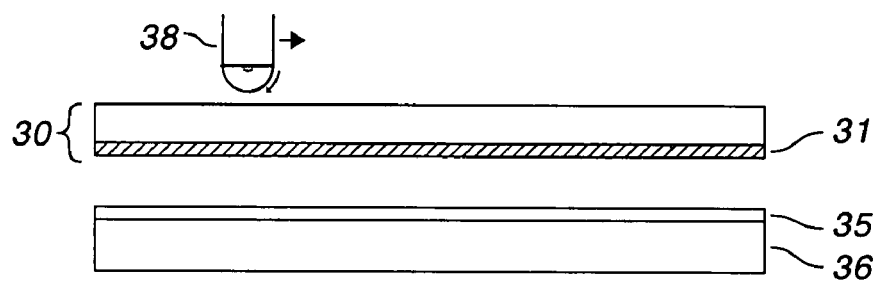
FIG. 3 illustrates, in cross-section, a method for bonding a conductive layer to substrate using toner powder as adhesive.

FIG. 3 illustrates a method for bonding a conductive layer to substrate using toner powder as adhesive. Patterned layer 35 of toner powder is applied to dielectric sheet 36, e.g. by printing on a separate sheet and laminating the sheet to the substrate or by printing on the substrate. For transfer, ribbon 30 brought into contact with patterned layer 35 and heated roller 38 is brought down to adhere a selected portions of conductive layer 41 to dielectric sheet 36. Heated roller need not be the same width (dimension into the drawing) as dielectric sheet 36 but preferably is the same width or wider than dielectric sheet 36. When ribbon 30 is separated from toner 35, portions of conductive layer 31 adhere to toner 35, thereby producing a patterned, conductive layer on dielectric sheet 36.

Figure 4:
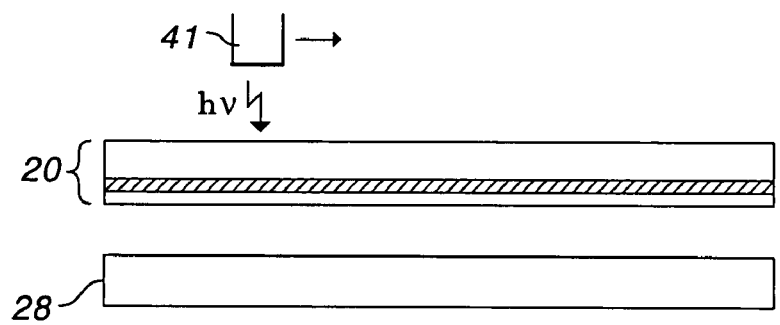
FIG. 4 illustrates, in cross-section, another method for bonding a conductive layer to substrate using toner powder as adhesive.

FIG. 4 illustrates another method for bonding a conductive layer to a dielectric sheet. For transfer, ribbon 20 brought into contact with dielectric sheet 28 and transient heating is effected without localized pressure by laser 41, which scans the substrate, preferably in a raster pattern. There is slight pressure from ribbon 20 being brought into contact with dielectric sheet 28.

FIG. 5 illustrates an antenna constructed in accordance with the invention. In FIG. 5, the elements of a planar, phased array antenna are made by thermally transferring conductor to a dielectric sheet that becomes part of the antenna. The desired conductive pattern is printed during transfer or is printed prior to transfer using the pattern of xerographic toner particles to define the elements of the antenna. Aperture plate 51 and tuning stubs 53 are both made in this manner.

In FIG. 5, aperture plate is transferred on one major surface of a dielectric sheet. Tuning stubs, such as stub 53, are transferred to a second dielectric sheet or to the reverse side of dielectric sheet 51 in alignment with the apertures. A ground plate can be made in any suitable manner and spaced from the active elements. The antenna illustrated in FIG. 5 has both inductive and capacitive components to its impedance by the interaction of the aperture plate and the tuning stubs. FIG. 5 is based upon FIG. 1 in U.S. Pat. No. 5,418,541 (Schroeder et al.). The operation of planar, phased array antennas is known in the art.

FIG. 6 illustrates a spiral antenna exhibiting essentially inductive impedance. Spiral 61 is made by transferring a conductive layer to dielectric sheet 62. Lead 64 is printed over insulating layer 65 and coupled to the inner end of the spiral by conductive adhesive. There is insignificant capacitive coupling between lead 64 and the spiral 61, unless very high frequency signals are used. Spiral 61 can be wound bifilarly and have both leads extending in the same direction on the same side of dielectric sheet 62 with no crossover. Spiral 61 can also serve as an inductor.

The invention thus provides an antenna in which an element is thermally bonded to a dielectric sheet or substrate. The sheet can be rigid or flexible, flat or curved in use. An antenna constructed in accordance with the invention can be changed easily for prototype or low volume production. An element can thermally bonded to a substrate by toner powder and the element can be patterned directly from a xerographic print. Dimensional tolerances are small, even in terms of wavelength, and the thickness of the dielectric sheet determines the size of cavities or the spacing of elements.

Having thus described the invention, it will be apparent to those of skill in the art that various modifications can be made within the scope of the invention. For example, a hot platen laminator can be used instead of heated rollers when transferring a patterned toner powder. The bond between layers can be enhanced by treating a layer with an adhesion promoter. Active or passive elements of an antenna can be made in accordance with the invention. An element need not be created in a single transfer. Plural transfers can be used to create a pattern.

What is claimed as the invention is:

1. An antenna characterized in that the antenna includes a conductive layer thermally bonded to a dielectric sheet with a layer of xerographic print toner between the conductive layer and the dielectric sheet, wherein the conductive layer has a thickness on the order of thousands of angstroms and the xerographic print toner is thermally activated to attach the conductive layer to the dielectric sheet in a predetermined pattern to define an active element of said antenna.

2. The antenna as set forth in claim 1 wherein said antenna includes plural layers of thermally transferred elements.

3. The antenna as set forth in claim 1 wherein said conductive layer is thermally transferred in a pattern to provide a group of elements for said antenna.

4. The antenna as set forth in claim 3 wherein said conductive layer exhibits substantially inductive impedance.

5. The antenna as set forth in claim 4 wherein said conductive layer is a spiral.

6. An antenna characterized in that the antenna includes a conductive layer thermally bonded to a dielectric sheet with a layer of adhesive between the conductive layer and the dielectric sheet, wherein the conductive layer has a thickness on the order of thousands of angstroms and the adhesive is thermally activated to attach the conductive layer to the dielectric sheet in a matrix of transfers to define an active element of said antenna.

7. The antenna as set forth in claim 6 wherein said antenna includes plural layers of thermally transferred elements.

8. The antenna as set forth in claim 6 wherein said conductive layer is thermally transferred in a matrix pattern to provide a group of elements for said antenna.

9. The antenna as set forth in claim 8 wherein said conductive layer exhibits substantially inductive impedance.

10. The antenna as set forth in claim 9 wherein said conductive layer is a spiral.

* * * * *